United States Patent
Oppelt et al.

(10) Patent No.: US 6,864,747 B1
(45) Date of Patent: Mar. 8, 2005

(54) AMPLIFIER DEVICE WITH AN ADJUSTABLE OPERATING-CONTROL

(75) Inventors: Ralph Oppelt, Uttenreuth (DE); Markus Vester, Nürnberg (DE)

(73) Assignee: Siemens Aktiengesellschaft, Münich (DE)

( * ) Notice: Subject to any disclaimer, the term of this patent is extended or adjusted under 35 U.S.C. 154(b) by 0 days.

(21) Appl. No.: 09/958,717

(22) PCT Filed: Apr. 4, 2000

(86) PCT No.: PCT/DE00/01045

§ 371 (c)(1),
(2), (4) Date: Feb. 19, 2003

(87) PCT Pub. No.: WO00/62416

PCT Pub. Date: Oct. 19, 2000

(30) Foreign Application Priority Data

Apr. 14, 1999 (DE) .......................... 199 16 902

(51) Int. Cl.[7] .............................. H03G 3/10; H03F 3/26
(52) U.S. Cl. ....................................... 330/285; 330/267
(58) Field of Search .................................. 330/285, 267

(56) References Cited

U.S. PATENT DOCUMENTS

| | | | |
|---|---|---|---|
| 3,984,783 A | | 10/1976 | Bickley |
| 4,207,523 A | * | 6/1980 | Acker ........................ 375/286 |
| 4,482,867 A | | 11/1984 | Marchand et al. |
| 4,500,848 A | * | 2/1985 | Haentjens et al. |
| 4,871,976 A | * | 10/1989 | Watanabe et al. ............. 330/69 |
| 5,331,290 A | * | 7/1994 | Harford et al. ............. 330/254 |
| 5,879,303 A | | 3/1999 | Averkiou et al. |
| 6,047,168 A | * | 4/2000 | Carlsson et al. ............ 455/126 |

FOREIGN PATENT DOCUMENTS

| | | |
|---|---|---|
| DE | 24 25 918 B2 | 12/1974 |
| DE | 40 39 983 C2 | 9/1993 |
| JP | 52-28844 | 4/1977 |

OTHER PUBLICATIONS

Tietze, et al.; "Semiconductor Circuit Technology" Präzisionsnetzgerät miteinstellbarer Strombegrenzung Section 13.7.3; 1974; pp. 400–401.
Tietze, et al.;"Das Transistor—Rauschen" (Semiconductor Circuit Technology); Section 4.10, 1990; pp. 78–82.
Siemens Semiconductor Group "Individual Semiconductors, Discrete and RF Semiconductor"; Databook Second Edition Part II; 1997 ; pp. 1073–1078.
Von Parpart, Joachim; Section 11.1 & 11.2 "Breitbandige Ferrit–Hoch frequenztransformatoren—Schaltungen und Systeme"; 1997; pp. 130–131.

* cited by examiner

*Primary Examiner*—Patricia Nguyen
(74) *Attorney, Agent, or Firm*—Schiff Hardin LLP (57) ABSTRACT

A device for amplifying an input signal comprising a semiconductor unit having at least one semiconductor component, and circuit for setting an operating point of the semiconductor unit. The circuit is designed such that during amplification of the input signal, an operating point of the semiconductor unit can be varied automatically and independently for a measured value, in accordance with a predetermined profile of a maximum possible signal amplitude of the input signal between a distortion-optimized setting, for high maximum possible signal amplitude and a noise-optimized setting for a low maximum possible signal amplitude.

14 Claims, 6 Drawing Sheets

AMPLIFIER DEVICE WITH AN ADJUSTABLE OPERATING-CONTROL

BACKGROUND OF THE INVENTION

1. Field of the Invention

The present invention relates to devices for amplifying an input signal. Specifically, the present invention relates to using amplifier devices in pulse echo apparatus or in ultrasonic apparatus.

2. Discussion of the Related Art

In terms of the present invention, a pulse echo apparatus can be in the form of a radar apparatus, a sonar apparatus or an ultrasonic apparatus, wherein a transmission signal having a very high signal amplitude is radiated via a correspondingly designed converter into a medium to be examined, such as an air monitoring space in the case of the radar apparatus, a water monitoring space in the case of the sonar apparatus, or a human body in the case of the ultrasonic apparatus. A reception signal produced by reflection in the medium to be examined is detected and evaluated after corresponding amplification. Such reception signal may form the input signal of the amplifier device.

In the case of an ultrasonic apparatus, a reception signal attributable to near-surface reflection in a human body to be examined has a relatively high signal amplitude. By contrast, on account of a high degree of tissue attenuation, an input signal produced by reflection from a deeper tissue layer has a very small signal amplitude. In order that a region lying deep in the tissue can still be imaged well, good noise behavior is demanded of an amplifier device. This means that the amplifier device should be embodied in a low-noise and noise adapted manner.

U.S. Pat. No. 5,879,303 discloses a specific imaging method for an ultrasonic apparatus. In this so-called THI (Tissue Harmonic Imaging) method, the first harmonic of the reception signal is evaluated. Non-linearity in human tissue gives rise to this first harmonic (second harmonic component) of the fundamental frequency of the transmission signal that is radiated in. Therefore, an amplifier device used in this connection should be designed such that it has very little distortion in order that the measurement result is not corrupted by an additional harmonic component produced in the amplifier device.

Joachim von Parpart's "Breitbandige Ferrit-Hochfrequenztrans formatoren" [Broadband Ferrite Radio frequency Transformers], Huthig Verlag Heidelberg, 1997, pages 130 and 131, discloses that practically no second-order distortion, i.e. no first harmonic of the fundamental frequency, arises in a push-pull amplifier. In this case, components of the input signal having different polarity are amplified separately in two structurally identical individual amplifiers and combined again at the output to form a common output signal. While the input signal is amplified, even-order distortions, including the first harmonic, largely average out during push-pull amplification. Thus, low-distortion amplification is achieved.

Furthermore, the Siemens-Datenbuch "Individual Semiconductors, Discrete and RF Semiconductors", second edition, 1997, pages 1073 to 1078, discloses that an amplifier device comprising a bipolar transistor as a semiconductor amplifier operates in a particularly low-distortion manner if a high collector quiescent current is provided. This places an operating point into a region of the transistor characteristic curve in which the transistor has a practically linear behavior. As the collector quiescent current rises, the characteristic curve linearity rises and so does the degree of freedom from distortion that can be achieved with the amplifier device.

However, the low-distortion amplifier devices mentioned do not afford optimization with regard to noise. Moreover, a high collector quiescent current favorable for offering freedom from distortion leads, over high static power loss.

U. Tietze, Ch. Schenk, "Halbleiter-Schaltungstechnik" [Semiconductor Circuitry], Springer-Verlag, 9th edition, 1991, pages 78 to 82 describes that the noise behavior of a transistor depends to a critical extent on the collector quiescent current. In particular, the inherent noise of the transistor has a minimum at a predetermined collector quiescent current. The transistor noise deteriorates again at a higher collector quiescent current.

Consequently, the known amplifier devices are optimized either with regard to their noise behavior or with regard to their distortion behavior.

SUMMARY OF THE INVENTION

It is an object of the present invention to specify an amplifier device for amplifying an input signal which exhibits both little noise and little distortion.

It is another object of the invention to specify an amplifier device having a low static power loss.

The amplifier device according to the present invention comprises at least one semiconductor unit having a semiconductor component, and means for setting the operating point of the semiconductor unit, the means being designed in such a way that, during the amplification of the input signal, an operating point of the semiconductor unit can be varied automatically and in a manner free from measured values in accordance with a predetermined profile of a maximum possible signal amplitude of the input signal between a distortion-optimized setting for a high maximum possible signal amplitude and a noise-optimized setting for a low maximum possible signal amplitude.

The present invention is based on the insight that an amplifier device can satisfy the contrasting requirements of good noise behavior and the greatest possible freedom from distortion if a departure is made from the constant operating-point setting that has always been used heretofore in the prior art. In this case, it is possible to take advantage of the fact that the basic profile of the maximum possible input signal is often known. The operating-point setting can thus be adapted at any time to a present maximum possible signal amplitude. On account of the knowledge about the basic signal profile, this adaptation is also possible without regular measurement of the signal amplitude during normal operation of the amplifier. The operating point can thus be varied automatically without assistance of a preset measured value, that is to say, in a manner free from measured values.

Means for variable setting of the operating point are also provided. These means can then be used to adapt the preset operating-point setting to the profile of the amplitude of the input signal in that, depending on the maximum possible signal amplitude, a setting between a distortion optimization for the largest maximum possible signal amplitude and a noise optimization for the smallest maximum possible signal amplitude is provided. The difference between the largest and the smallest maximum possible signal amplitude typically amounts to at least one order of magnitude. It may also encompass three orders of magnitude or more. The means for variable setting of the operating point may comprise storage of the assignment between maximum possible signal amplitude and the respectively associated operating-point setting, e.g. in electronic form or in digital form as a stored table.

Where the amplifier device is used in a pulse echo apparatus, the operating point of the semiconductor unit is set with regard to minimum distortions at the beginning of a reception phase. This is because an echo signal from a near-surface scattering body of the medium to be examined is received at the beginning of the reception phase. Given a corresponding configuration of the scattering body, such near-surface echo signal can have a high maximum signal amplitude with a large signal-to-noise ratio, since the associated sound signal experiences only little attenuation on its short path through the medium to be examined. Consequently, optimization with regard to noise is superfluous at the beginning of the reception phase. In this case, a high maximum signal amplitude is to be understood as voltages up to 1 Vpp (voltage peak-to-peak).

On the other hand, an echo signal reflected from a deeper region of the medium to be examined has a very small maximum possible signal amplitude on account of the longer propagation path in the medium to be examined and the associated higher attenuation. Such a low maximum signal amplitude may assume a value of up to 1 mVpp. If such an echo signal from a deeper region is present as an input signal at the amplifier device, then it is advantageous to optimize the operating-point setting with respect to noise behavior. In order still to be able to detect low signal amplitude, a high signal-to-noise ratio is advantageous. On the other hand, low signal amplitude only slightly modulates the semiconductor unit about the set operating point such that practically no appreciable distortion occurs. Separate distortion optimization is thus superfluous.

In a pulse echo apparatus such as an ultrasonic apparatus, the amplitude of the input signal depends on material parameters of the medium to be examined, based upon a fundamental frequency of a transmission signal radiated into the medium, and also on the depth of a scattering body in the medium to be examined, i.e. on the propagation time in the medium to be examined. Important material parameters in this connection are the propagation speed and attenuation.

Irrespective of the embodiment of the medium to be examined, these material parameters can essentially be determined before beginning the examination, and can thus can be regarded as known. The fundamental frequency of the transmission signal is defined before an examination and is thus likewise known. The propagation time in the medium to be examined can be determined without difficulty using a concurrent system clock triggered by the transmission signal. This means that all information required to predict the basic profile of the input signal is available. Whether the present signal amplitude will actually assume its predictable maximum possible value in each case will still depend on whether a scattering body having a high reflectivity is also present at the corresponding depth in the medium to be examined for each individual case. The means of setting the operating point are then designed, such that the expected maximum possible signal amplitude can be predicted using information already available before beginning the amplification, and the operating point can then be set to the most favorable value in each case. Noise optimization and distortion optimization are thus achieved simultaneously.

An advantage of the present invention arises from a refinement in which the semiconductor unit has a gain factor having has values that differ from one another as little as possible in the case of the noise-optimized operating-point setting and in the case of the distortion-optimized operating point setting. This is because a high degree of dependence, e.g. a linear dependence, of the gain factor on the operating point setting has the effect that adaptation of the operating-point setting cannot result in a decisive reduction of the distortions in the case of a high signal amplitude. It is therefore favorable to have the values of the gain factor differ from one another by at most 50% in the case of the possible operating-point settings.

In a semiconductor component, setting of the operating point is usually effected by means of a current or voltage source generally in conjunction with at least one resistor, such as a non-reactive resistor. In a preferred embodiment, therefore, at least one variable resistor is provided which can be used to vary the operating-point setting of the semiconductor unit. By means of an additional electrical lead to the variable resistor, its resistance, and hence the operating-point setting, can be modified in a simple manner.

A further advantage arises due to the fact that the operating-point setting is varied by means of a variable current or voltage source. A supply current or a supply voltage can be varied as a function of the signal amplitude of the input signal. Since the semiconductor unit has an electrical lead for the supply current or the supply voltage anyway, an additional electrical line is not required.

Adaptation of the supply power fed into the semiconductor unit by means of the current or voltage source as a function of the signal amplitude of the input signal, also has the effect of reducing static power loss. A high supply power is required only in the case of necessary distortion optimization, such as in the case of high signal amplitude, and is actually set only in that case. In the case of a lower signal amplitude, the system operates with a significantly lower fed-in supply power for the purpose of noise optimization. On average this also results in a lower static power loss than in the case for a permanent design for a high signal amplitude.

In a further preferred embodiment, provision is made of a control unit for corresponding setting of the operating point. To that end, the control unit is electrically conductively connected to the variable resistor or the variable current or voltage source. In the control unit, the expected signal amplitude is predicted using available information. In accordance with predicted signal amplitude, the control unit then sets the value of the variable resistor or of the current or voltage source to produce the desired operating point. In this case, an assignment between predicted signal amplitude and an associated value of the variable resistor of the variable supply current or of the variable supply voltage may be stored electronically or digitally in tabular form in the control unit.

In a further preferred embodiment, provision is made of a control unit with which the operating-point setting can be varied periodically. This embodiment is particularly advantageous when the temporal profile of the input signal is repeated at periodic intervals. The control unit then merely requires a start instant in the form of a trigger pulse, in order to subsequently adapt the operating point to the amplitude of the input signal independently without any further information supplied externally. A periodic input signal is present such as in the case of a pulse echo apparatus which at periodic time intervals emits a transmission signal into the medium to be examined.

A further advantage is due to the fact that the semiconductor unit comprises at least one negative feedback semiconductor component. The negative feedback reduces dependence on non-linear properties of the semiconductor component. This has a positive effect on the distortion behavior of the amplifier device.

In a further preferred embodiment, a push-pull amplifier is provided. The positive effect of a push-pull amplifier with regard to the suppression of harmonics is already known from the prior art. A push-pull amplifier can be simply constructed from two complementary transistors, such as bipolar complementary transistors. Thus, each of the two transistors is essentially responsible for amplifying one polarity of the input signal.

A further advantage is due to the fact that the two complementary transistors are arranged in a manner balanced to ground with respect to one another. This is because such an arrangement ensures that a variation of the operating-point setting does not present a transient process on the leads of the amplifier device.

In a further preferred embodiment, the amplifier device also comprises at least one bipolar current limiter a passive arrangement. A bipolar current limiter is understood to be a two-terminal network which limits a signal having a high signal amplitude to a positive or a negative limit current depending on the signal polarity. For a signal level beyond said limit current, the bipolar current limiter virtually acts as a high-impedance current source. In the case of a signal level lying below said limit current, the bipolar current limiter behaves like a short circuit in the theoretical ideal case, and like a non-reactive resistor having a low resistance in the case of a practical realization.

Such a bipolar current limiter is useful principally when the transmission signal of a pulse echo apparatus is also transmitted via the amplifier device before being radiated into the medium to be examined. By virtue of the bipolar current limiter, the transmission signal is then switched largely unimpeded and unloaded. Moreover, the bipolar current limiter protects the actual amplifier device against any very high signal amplitude of the transmission signal. By contrast, the bipolar current limiter has no influence on the input signal since its signal amplitude always lies below the limit current.

The amplifier device is advantageously used as a preamplifier in a pulse echo apparatus, in particular in an ultrasonic apparatus, or in a radar apparatus or in a sonar apparatus. In the case of a pulse echo apparatus, the basic profile of the input signal can be predicted on the basis of the known parameters of the medium to be examined and on the basis of the known transmission signal. This predictable profile of the maximum possible input signal is then used for corresponding setting of the operating point. An appropriate object to be examined is, in the case of an ultrasonic apparatus, the human body or a workpiece made of a solid inorganic material.

DETAILED DESCRIPTION OF THE PRESENTLY PREFERRED EMBODIMENTS

Figure 1:
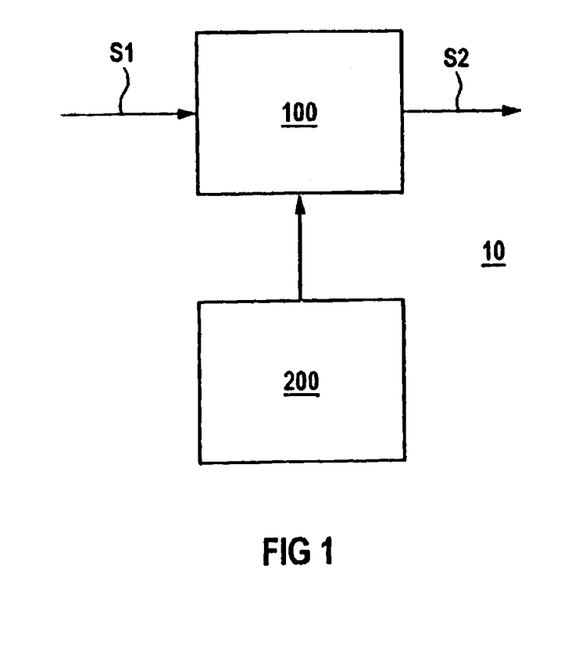
FIG. 1 shows an amplifier device with variable setting of the operating point according to the present invention.

FIG. 1 shows an amplifier device 10 having a semiconductor unit 100 and means 200 for setting the operating point. The amplifier device 10 converts an input signal S1 into an output signal S2 after noise and distortion-optimized amplification. A signal amplitude of the input signal S1 is known in terms of its basic temporal profile. In accordance with this known profile, means 200 for setting the operating point adapts the present position of the operating point of the semiconductor unit 100 by setting a noise-optimized operating point in the case of a low signal amplitude of the input signal S1 and a distortion-optimized operating point in the case of a high signal amplitude. Since the basic profile of the signal amplitude is known, the amplifier device 10 does not require any present measurement of the input signal 51 for the adapted setting of the operating point.

The semiconductor unit 100 represented in FIG. 1 can also have a voltage gain of $\leq 1$. An amplifier device 10 designed in this way then serves for impedance matching or for providing a higher output power for a load (not shown).

Figure 2:
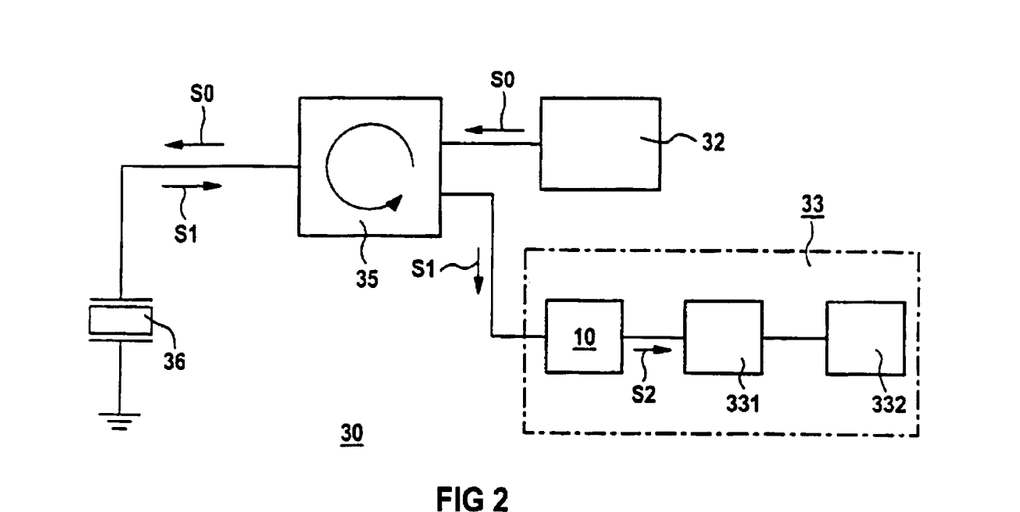
FIGS. 2 and 3 show embodiments of an ultrasonic apparatus having an amplifier device according to the present invention.

FIG. 2 illustrates an ultrasonic apparatus 30, in which the amplifier device 10 shown in FIG. 1 is used as a preamplifier in a reception unit 33. In addition to the reception unit 33, the ultrasonic apparatus 30 comprises a transmitting unit 32, a transmitting/receiving changeover switch 35 and a sound transducer 36. Sound transducer 36 can be constructed from a plurality of individual transducers not illustrated in FIG. 2.

The transmitting unit 32 generates a transmission signal S0 having a fundamental frequency and a very high signal amplitude of about 200 Vpp, for example. The transmission signal S0 is fed to the sound transducer 36 via the transmitting/receiving changeover switch 35. Sound transducer 36 transforms the transmission signal S0 into a sound signal which is radiated into a medium (not shown) to be examined. The medium to be examined may be a human body in the context of medical diagnosis or a workpiece made of a solid material, such as a metal body, in the context of non-destructive materials testing.

The sound signal is reflected at various points on its propagation path through the medium to be examined. These echo signals are detected by the sound transducer 36 and converted back into an electrical reception signal which passes via the transmitting/receiving changeover switch 35 as input signal S1 into the amplifier device 10.

Thus, the signal amplitude of the input signal S1 substantially depends on where in the medium to be examined the associated reflection occurred. While an echo signal from a near-surface region of the medium to be examined leads to a high signal amplitude, an echo signal from a region lying deep within the medium to be examined brings about an input signal S1 having a very low signal amplitude on account of path attenuation in the medium to be examined.

In order to compensate for this system dictated variation in the signal amplitude, the reception unit contains a TGC (Time Gain Control) module 331. This TOC module 331 compensates any decrease caused by attenuation in the medium to be examined, such as any signal amplitude of the input signal 10 31 by means of a propagation-time-dependent gain. Attenuation dictates that this gain compensation may amount to in excess of 60 dB.

The input signal S1, even before passing through the TGC module 331, is first pre-amplified with regard to its evaluation in a processing module 332 of the reception unit 33 in the amplifier device 10. In the processing module 332 downstream of the TGC module 331, echo signals from zones located deep within the medium to be examined are reconstructed from the input signal S1. Moreover, a signal component of the input signal 31 whose frequency corresponds precisely to a first harmonic of the fundamental frequency is also evaluated. The first harmonic is produced on account of the non-linear behavior in the medium to be examined.

The low signal amplitude of an echo signal from a region located deep in the area to be examined is preamplified in the amplifier device 10, with regard to a maximum signal-to-noise ratio. By contrast, the high signal amplitude of a near-surface echo signal is preamplified with respect to the lowest possible distortion. The high signal amplitude means that a good signal-to-noise ratio is produced anyway. These different amplification criteria are achieved in the amplifier device by means of an operating-point setting adapted to the profile of the maximum possible signal amplitude.

Figure 3:
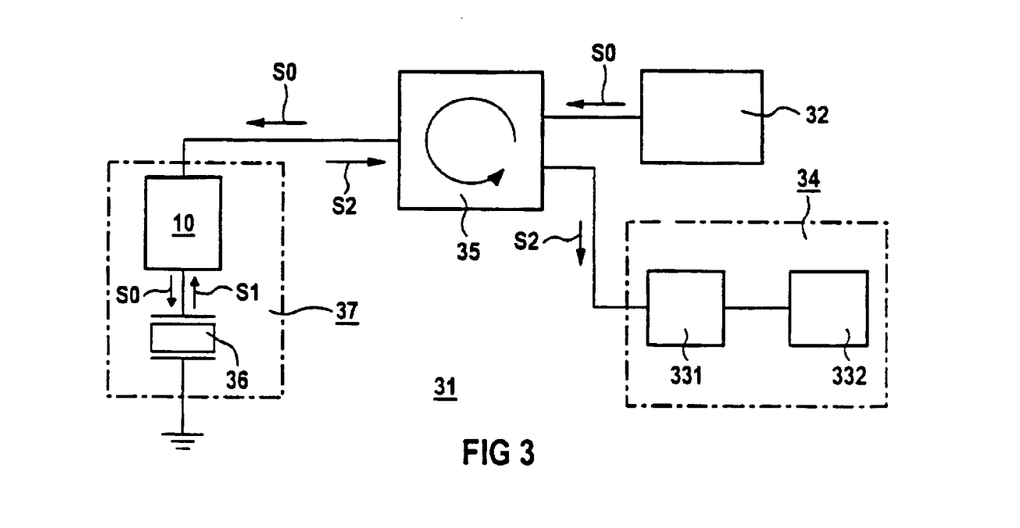

FIG. 3 shows a second embodiment of an ultrasonic apparatus 31. In contrast to the ultrasonic apparatus 30 of FIG. 2, the amplifier device 10 in the ultrasonic apparatus 31 is not situated within a reception unit 34, but rather between the transmitting/receiving changeover switch 35 and the sound transducer 36. The amplifier device 10 is integrated with the sound transducer 36 into a transducer head 37.

It is also possible to provide a plurality of amplifier devices 10, each assigned to a transducer segment, in order to divide the sound transducer 36 into a plurality of separate segments. In the event of integration into the transducer head 37, on account of the confined spatial conditions and also the associated limited possibility for heat dissipation, it is advantageous to have the amplifier device 10 located in a space-saving manner, i.e. from a small number of individual elements and with low power loss. By virtue of the operating-point setting variably adapted to the signal amplitude of the input signal S1, at least the requirement for a low power loss is satisfied, since on average a significantly lower power loss arises than in the case of a constant operating-point setting which is designed with regard to the maximum possible signal amplitude of the input signal S1.

Figure 4:
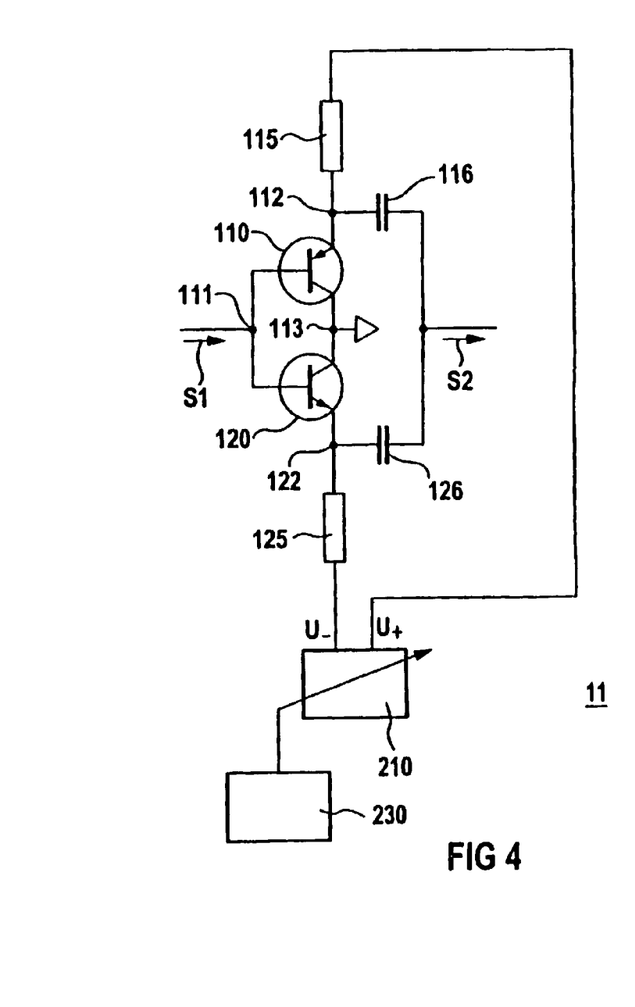
FIG. 4 shows an amplifier device with a variable voltage source according to the present invention.

FIG. 4 shows an exemplary embodiment of an amplifier device 11 in which the variable operating-point setting is realized by means of a variable voltage source 210. The value of a positive supply voltage U+ and the value of a negative supply voltage U−, which are present at the output of the variable voltage source 210, are controlled by means of a control unit 230 connected to the variable voltage source 210. Control unit 230 sets the two supply voltages U+ and U− in accordance with the expected signal profile of the input signal S1.

The amplifier device 11 is a push-pull amplifier in the form of a complemen-tary emitter follower, comprising a pnp transistor 110 and an npn transistor 120. The pnp transistor 110 and the npn transistor 120 have a common base terminal 111 and a common collector terminal 113 connected to ground potential. An emitter terminal 112 of the pnp transistor 110 and an emitter terminal 122 of the npn transistor 120 are respectively connected via a coupling capacitance 116 and 126 to a connecting node. At the fundamental frequency, the coupling capacitances 116 and 126 constitute an electrical short-circuit. The input circuit S1 is fed into the amplifier device 11 via the common base terminal 111.

The output signal S2 is present at the connecting node between two coupling capacitances 116 and 126. The two emitter terminals 112 and 122 are connected via a negative feedback resistor 115 and 125 to the positive and negative supply voltage U+ and U−, respectively, of the variable voltage source 210.

A collector quiescent current of the transistors 110 and 120 is set by way of the two supply voltages U+ and U−, respectively. This collector quiescent current 25 then essentially defines the present operating point of the two transistors 110 and 120. A variation in the two supply Voltages U+ and U− also effects an altered collector quiescent current, and hence a modification of the operating-point setting.

Figure 5:
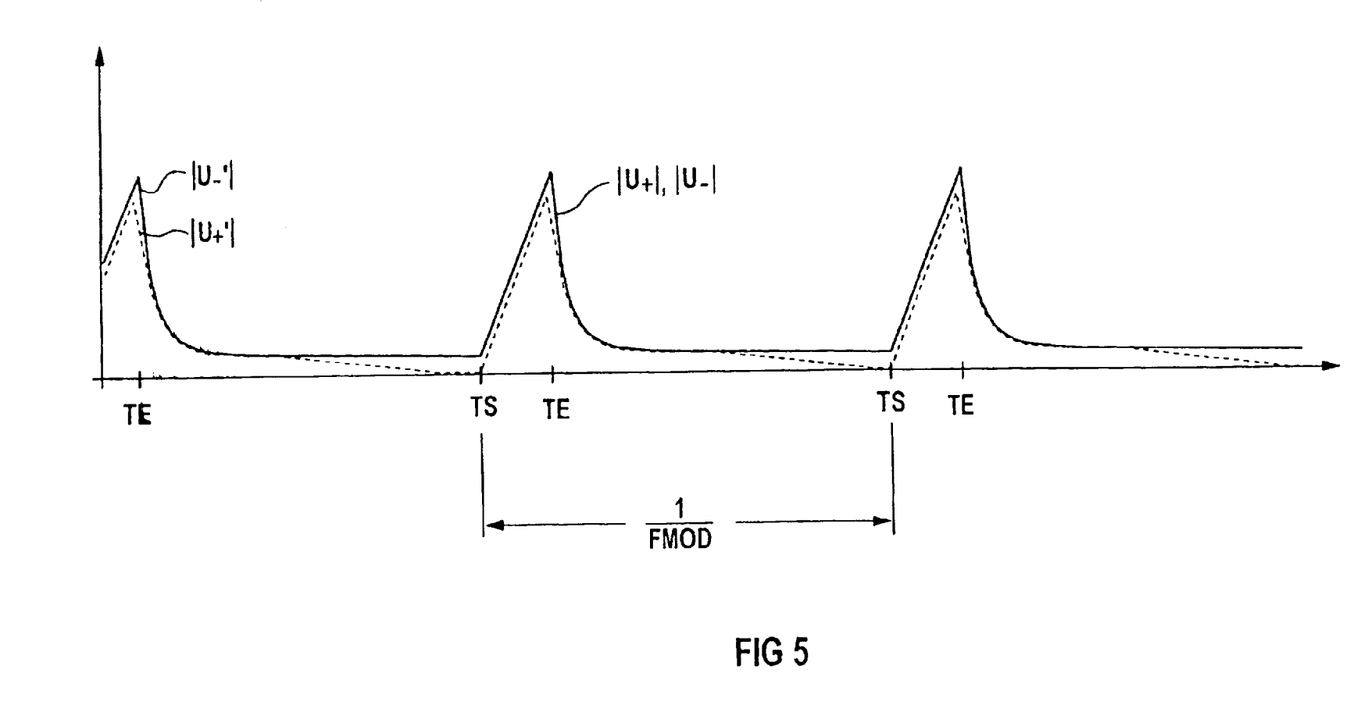
FIG. 5 shows a profile of a supply voltage according to the present invention.

FIG. 5 illustrates a typical temporal profile for the magnitude of the positive supply voltage U+ and of the negative supply voltage U−. In accordance with the mode of operation of the ultrasonic apparatuses 30 and 31 in which a transmission phase periodically alternates with a reception phase, supply voltages U+ and U− are also periodic. In FIG. 5, a reception instant TE and a transmission instant TS designate the beginning of a reception phase and of a transmission phase, respectively. The two supply voltages U+ and U− are periodically varied at a frequency designated as the modulation frequency FMOD in FIG. 5.

At the reception instant TE, the positive supply voltage U+ and the negative supply voltage U− assume their maximum and minimum value, respectively. These maximum and minimum values typically lie between +3V and +10V and between −3V and −10V. At the reception instant TE, the input signal S1 also has its highest maximum possible signal amplitude caused by an echo signal from a near-surface scattering body. In accordance with attenuation of the sound signal in the medium to be examined, the magnitude value of the two supply voltages U+ and U− also decreases approximately exponentially with time during the reception phase.

In general, pnp and npn transistors 110 and 120 do not have an exactly complementary behavior. In order to compensate for this slight deviation from the exact complementary behavior, it is possible at the beginning of a reception phase, to set magnitude values that deviate from one another slightly by up to 50% for the two supply voltages U+ and U−, in order to obtain the best possible distortion behavior.

Equally, it is possible for one of the supply voltages U+ or U− to be reduced to zero potential toward the end of a reception phase. Transistor 110 or 120 is then in the deactivated state, i.e. completely switched off.

Amplifier device 11 then operates as a normal single-ended emitter follower with only one of the transistors 110 or 120. The distortion level is acceptable for the very small signal amplitude of the input signal S1 at the end of the reception phase. The noise behavior can be improved further, since it is only determined by one of the two transistors 110 or 120, and not by a small-signal-based parallel circuit comprising pnp transistor 110 and npn transistor 120. Owing to the higher relevant charge carrier mobility, the npn transistor 120 has a better noise behavior than the pnp transistor 110, which is more favorable than deactivating pnp transistor 110 toward the end of a reception phase by means of a positive supply voltage 10 U+ reduced down to zero potential. Furthermore, such deactivation of the pnp transistor 110 further reduces power loss.

An embodiment with identical magnitude profiles of the supply voltages U+ and U− is denoted by a solid line in FIG. 5. For a different embodiment with magnitude profiles that deviate from one another, the profile for a positive supply voltage U+' is shown by a broken line and the profile for an associated negative supply voltage U−' is illustrated by a solid line.

After the conclusion of the reception phase the next transmission phase begins, during which a new transmission signal S0 is generated in the form of a transmission pulse in the transmission unit 32 and transmitted to the sound transducer 26. During the transmission phase, the two supply voltages U+ and U− are reset to their maximum and minimum value again. Resetting can take place relatively slowly since, in the ultrasonic apparatuses 30 and 31, a certain dead time (not shown in FIG. 5) may be provided between the end of the reception phase and the start of the transmission phase.

The duration of a reception phase depends on the desired maximum examination depth in the medium to be examined. In the case of a human body as the object to be examined, a reception phase typically lasts between 120 and 250 µs. This corresponds to a maximum examination depth in the human tissue of between approximately 9 and 19 cm. The desired maximum examination depth can be preselected on the ultrasonic apparatuses 30 and 31. The fundamental frequency is essentially determined by the sound transducer 36 chosen.

The input signal 51 has a high signal amplitude only for a short period of time compared with the entire reception phase. During this short period of time, the supply voltages U+ and U− are set to a high absolute value and a distortion-optimized operating point is set. In the remaining significantly longer residual time of the reception phase, owing to the low signal amplitude of the input signal S1 then present, the amplifier device 11 can also be operated with low absolute values for the two supply voltages U+ and U−. Consequently, when considered over the entire reception phase the operating-point setting is for the most part in the noise-optimized state. Owing to the associated low collector quiescent current, the result is a low static power loss.

The magnitude of the two supply voltages U+ and U− typically falls to below 50% of its initial value during the reception phase. By way of example, the start value of the positive supply voltage U+ is about 4 V and its end value is about 1.7 V.

In the case of the amplifier device 11 shown in FIG. 4, negative feedback resistors 115 and 125 have a value typically of 1 kΩ and the two coupling capacitances 116 and 126 have a value typically of 20 nF. Coupling capacitances 116 and 126 are dimensioned such that their reactance is small at the lowest relevant signal frequency of the input signal S1 and large at the modulation frequency FMOD, in comparison with a load impedance (not shown). The geometric means of the reactance of the coupling capacitances 116 and 126 at the lowest signal frequency and at the modulation frequency FMOD corresponds precisely to this load impedance. The pnp transistor 110 provided is a BFT 92 from Siemens and the npn transistor 120 provided is a BFR 92 from Siemens.

A typical collector quiescent current in the range between 0.5 mA and 1 mA is then obtained in the case of noise-optimized operating-point setting, while a collector quiescent current in the range between 3 mA and 10 mA results in the case of a distortion-optimized operating-point setting.

In the event of a variation in the collector quiescent current between 0.5 mA and 5 mA in the course of a modulation period, a voltage gain of the complementary emitter follower of FIG. 4 also varies within a range between about 0.65 and about 0.95. Such a slight fluctuation in the voltage gain in the case of the different operating-point settings during a modulation period is advantageous since otherwise, in the case of a voltage gain rising linearly with the collector quiescent current, the desired positive effect with regard to a reduction of the distortions is not established. This extensive independence of the voltage gain from the collector quiescent current is achieved by the negative feedback used in the amplifier device 11.

Fluctuation caused by the different operating-point settings in the voltage gain of the order of magnitude of about 50% is practically negligible compared with fluctuation in the signal amplitude of up to in excess of 60 dB caused by the attenuation of the medium to be examined, in particular a human body. Nevertheless, this additional fluctuation in the output signal S2 caused in the amplifier device 11 can also be compensated again by a corresponding additional correction factor in the TGC module 331 connected downstream.

Figure 6:
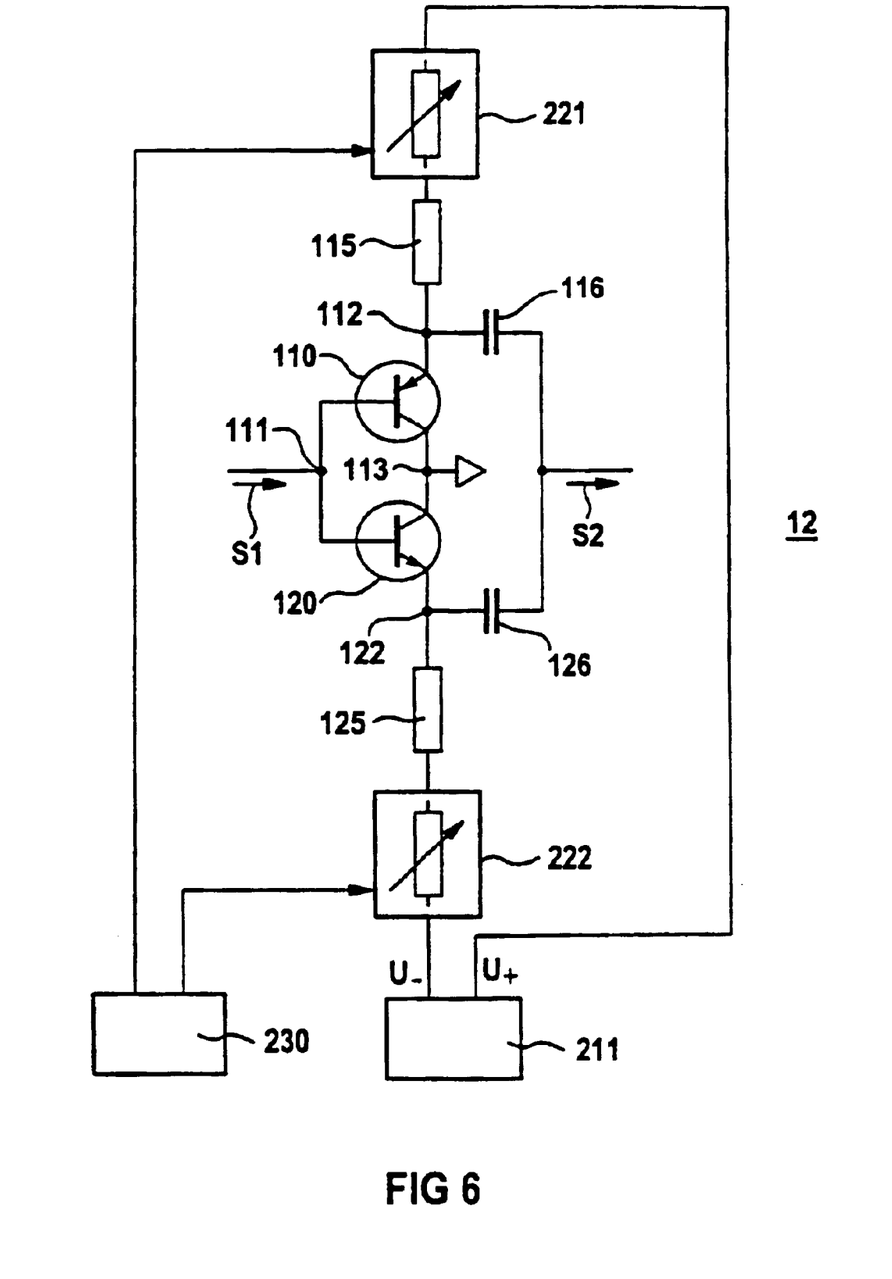
FIG. 6 shows an amplifier device with a variable resistor according to the present invention.

FIG. 6 illustrates an amplifier device 12 in which, in contrast to the amplifier device 11 of FIG. 4, the variable operating-point setting is not realized by means of a variable voltage 210, but rather by means of two variable resistors 221 and 222. The resistance of the variable resistors 221 and 222 is controlled by the control unit 230. The temporal profile of the resistances corresponds in principle to the profile of the two supply voltages U+ and U− which is shown in FIG. 5. The two variable resistors 221 and 222 are connected in series between a constant voltage source 211 and respective negative feedback resistors 115 and 125. This results in a variable operating-point setting by means of a collector quiescent current adapted to the input signal S1.

Figure 7:
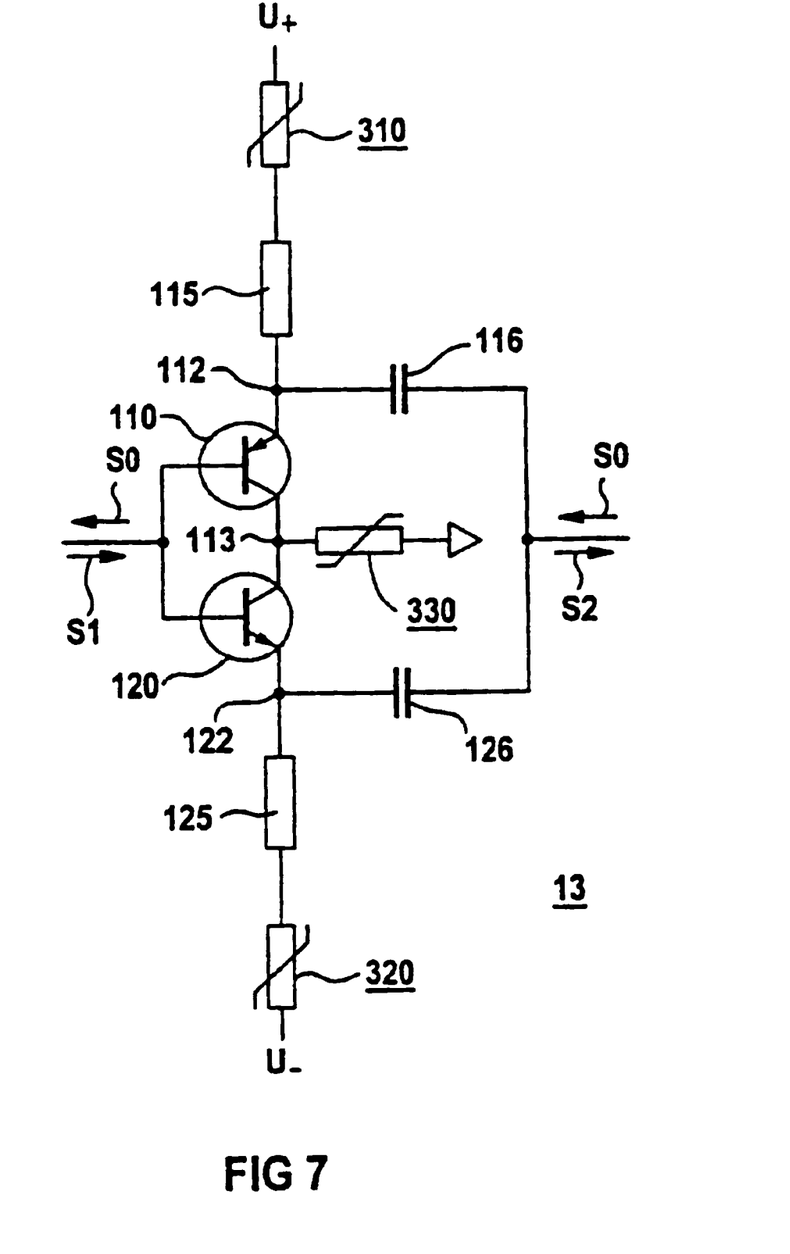
FIGS. 7 and 8 show embodiments of an amplifier device with a bipolar current limiter according to the present invention.
Figure 8:
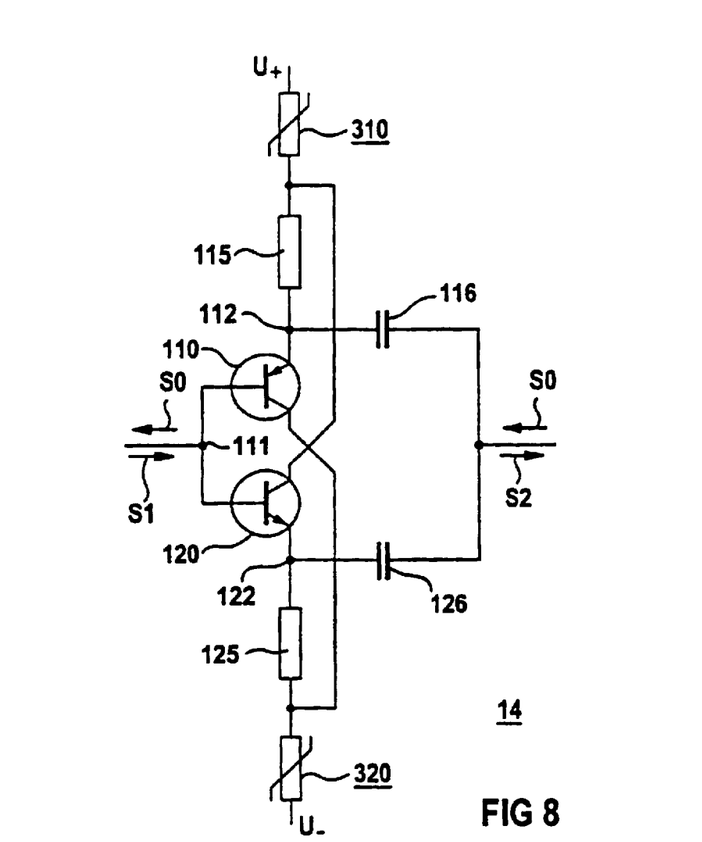

FIGS. 7 and 8 show an amplifier device 13 and 14 which, in accordance with the embodiment of the ultrasonic apparatus 31 of FIG. 3, are in each case integrated together with the sound transducer 36 into the transducer head 37. The amplifier devices 13 and 14 then also transmit the transmission signal S0 to the sound transducer 36. In order to ensure this transmission with at the same time an unrestricted gain function for the input signal S1, the amplifier device 13 of FIG. 7 contains a total of three bipolar current limiters 310, 320 and 330. By contrast, the amplifier device 14 of FIG. 8 manages with only two bipolar current limiters 310 and 320. Means 200 for variable setting of the operating point are not concomitantly shown in 30 the embodiments of FIGS. 7 and 8. In both embodiments however, in accordance with the amplifier devices 11 and 12 of FIGS. 4 and 6, a variable operating-point setting may be provided either by means of a variable voltage source 210 or by means of variable resistors 221 and 222.

Figure 9:
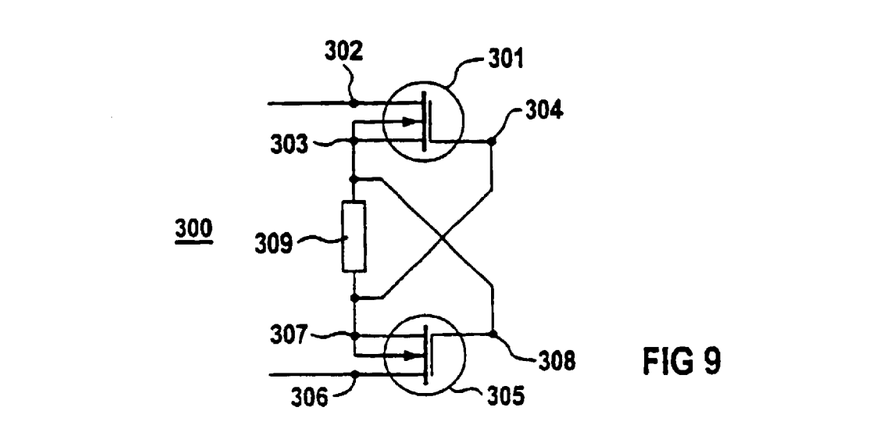
FIG. 9 shows a bipolar current limiter.

The bipolar current limiters 310, 320 and 330 of the amplifier devices 13 and 14 are in each case constructed according to the circuit principle, as shown in FIG. 9, of a passive bipolar current limiter 300. This bipolar current limiter 300 essentially comprises a first normally on MOSFET (Metal Oxide Semiconductor Field Effect Transistor) 301 having a first gate contact 304, a first source contact 303 and a first drain contact 302, and also a second normally on MOSFET 305 having a second gate contact 308, a second source contact 307 and a second drain contact 306. The two MOSFETs 301 and 305 are each of the same conduction type, the n type in the present case. The current-limiting effect is achieved in that the first gate contact 304 is fed back to the first source contact 303 via a feedback resistor 309, and the second gate contact 308, too, is fed back to the second source contact 307 via the same feedback resistor 309.

In this case, the first MOSFET 301 effects current limiting in the event of a positive voltage present between the first drain contact 302 and the second drain contact 306, and the second MOSFET 305 effects current limiting in the event of a negative voltage present between the two drain contacts 302 and 306.

The first and second MOSFETs 301 and 305 are connected in series via the feedback resistor 309. To that end, the first source contact 303 is connected to one and the second source contact 307 to the other of the two terminals of the feedback resistor 309. The two MOSFETs 301 and 305 are arranged with mutually opposite polarity within the series circuit of the bipolar current limiter 300.

In the case of a large signal amplitude, the bipolar current limiter 300 limits the current to a positive or a negative limit current depending on the polarity of the voltage present between the two drain contacts 302 and 306. By contrast, in the case of a small signal amplitude, the bipolar current limiter 300 behaves like a non-reactive resistor. This resistor is in this case produced as a series circuit comprising in each case an internal resistance of the first and of the second MOSFET 301 and 302, respectively, and also the feedback resistor 309. The bipolar current limiter 300 thus has a linear resistance behavior in proximity to the zero point in the case of a low signal amplitude.

In the case of the amplifier device 13 in accordance with FIG. 7, the two bipolar current limiters 310 and 320 are electrically connected in series between the variable voltage source 210 (not shown) and the feedback resistor 115 and 125, respectively.

By contrast, the third bipolar current limiter 330 connects the common collector terminal 113 to the ground potential.

The two bipolar current limiters 310 and 320 are dimensioned in such a way that they each still behave as linear resistors in the case of the highest collector quiescent current that occurs. In both bipolar current limiters 310 and 320, the respective feedback resistor 309 is very much smaller than the feedback resistor 115 and 125, respectively. This value is typically 100 Ω in the bipolar current limiters 310 and 320.

On account of the symmetrical circuit arrangement, practically no DC current flows via the third bipolar current limiter 330 in the case of supply voltages U+ and U− of identical magnitude. Its feedback resistor 309 is likewise small in comparison with the feedback resistors 115 and 125. It, too, has a value typically of 100 Ω. In the reception phase, the amplifier device 13 behaves essentially like the amplifier device 11 of FIG. 4. In the transmission phase, the transmission signal S0 passes via the two coupling capacitances 116 and 126, and also via one of the base-emitter diode junctions of the two transistors 110 and 120 to the sound transducer 36. On account of the current-limiting property of the bipolar current limiters 310, 320 and 330, only a relatively small proportion of energy of the transmission signal S0 is lost in this case.

The amplifier device 14 of FIG. 8 differs only insignificantly from the amplifier device 13 of FIG. 7. In the amplifier device 14, the collector terminals of the two transistors 110 and 120 are no longer short-circuited, but rather are electrically connected to a connecting node between the feedback resistor 125 and the bipolar current limiter 320 and, respectively, to a connecting node between the feedback resistor 115 and the bipolar current limiter 310. The third bipolar 10 current limiter 330 is obviated in this circuit variant. In the reception phase, the amplifier device 14 thus has a larger modulation range. In the transmission phase, the omission of the connection to the ground potential via the third bipolar current limiter 330 means that there is an even lower loading on the transmission signal S0 through the amplifier device 14.

Both the amplifier device 13 and the amplifier device 14 are able to forward the transmission signal S0 without being damaged by the very high signal amplitude of the transmission signal S0, and also without appreciably loading the transmission signal S0.

Although modifications and changes may be suggested by those skilled in the art to which this invention pertains, it is the intention of the inventors to embody within the patent warranted hereon all changes and modifications that may reasonably and properly come under the scope of their contribution to the art.

What is claimed is:

1. A device for amplifying an input signal, the device comprising:

a semiconductor unit having an operating point, the unit including at least one semiconductor component, and an operating point setting component for setting an operating point of the semiconductor unit, whereby during amplification of said input signal, the operating point of the semiconductor unit can be varied automatically and independent of measured values in accordance with a predetermined profile of a maximum possible signal amplitude of the input signal between a distortion-optimized setting for a high maximum possible signal amplitude and a noise-optimized setting for a low maximum possible signal amplitude.

2. The device as claimed in claim 1, wherein the semiconductor unit has a gain factor whose value for a noise-optimized setting differs by at most 50% from the value for a distortion-optimized setting.

3. The device as claimed in claim 1, wherein the operating point setting component comprises at least one variable current or voltage source.

4. The device as claimed in claim 1, wherein the operating point setting component comprises at least one variable resistor.

5. The device as claimed in claim 1, wherein the operating point setting component comprises a control unit, which controls a temporal profile of the setting of the operating point in a predetermined manner.

6. The device as claimed in claim 5, wherein the control unit is designed for setting a periodic setting of the operating point.

7. The device as claimed in claim 6, including at least one negative feedback semiconductor component.

8. The device as claimed in claim 1, including a push-pull amplifier constructed with two complementary transistors.

9. The device as claimed in claim 8, wherein said one of the two complementary transistors is connected to a positive supply voltage ($U_+$) of a variable voltage source and the other of the two complementary transistors is connected to a negative supply voltage of the variable supply voltage source, whereby, magnitude profiles of the two supply voltages differ from one another.

10. The device as claimed in claim 8, wherein said two complementary transistors are arranged in a manner balanced to ground with respect to one another.

11. The device as claimed in claim 8, wherein said two complementary transistors form a complementary emitter follower circuit.

12. The device as claimed in claim 1, including at least one bipolar current limiter.

13. The use of the device as claimed in claim 1 in a pulse echo apparatus.

14. The use of the device as claimed in claim 1 in an ultrasonic apparatus.

* * * * *